(12) United States Patent
Nomura et al.

(10) Patent No.: US 11,342,280 B2
(45) Date of Patent: May 24, 2022

(54) MODULE AND METHOD FOR MANUFACTURING THE SAME

(71) Applicant: Murata Manufacturing Co., Ltd., Kyoto (JP)

(72) Inventors: Tadashi Nomura, Kyoto (JP); Shin Furuya, Kyoto (JP); Toru Koidesawa, Kyoto (JP); Motohiko Kusunoki, Kyoto (JP); Tetsuya Oda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/210,630

(22) Filed: Mar. 24, 2021

(65) Prior Publication Data

US 2021/0210438 A1     Jul. 8, 2021

Related U.S. Application Data

(63) Continuation of application No. PCT/JP2019/037882, filed on Sep. 26, 2019.

(30) Foreign Application Priority Data

Sep. 27, 2018    (JP) .............................. JP2018-182554

(51) Int. Cl.
     *H05K 1/18*        (2006.01)
     *H01L 23/552*     (2006.01)
     (Continued)

(52) U.S. Cl.
     CPC ............ *H01L 23/552* (2013.01); *H01L 21/56* (2013.01); *H01L 23/295* (2013.01); *H05K 1/181* (2013.01);
     (Continued)

(58) Field of Classification Search
     CPC .... H05K 1/18; H05K 1/181–187; H05K 3/28; H05K 3/282–284; H05K 5/065;
     (Continued)

(56) References Cited

U.S. PATENT DOCUMENTS

| 6,743,975 B2 * | 6/2004 | Kolb .................... H05K 1/0218 257/E23.116 |
| 8,988,885 B2 * | 3/2015 | Sawatari ................ H01L 24/97 361/728 |

(Continued)

FOREIGN PATENT DOCUMENTS

| JP | 2015-201479 A | 11/2015 |
| JP | 2016-219711 A | 12/2016 |

(Continued)

OTHER PUBLICATIONS

International Search Report for PCT/JP2019/037882 dated Nov. 26, 2019.
Written Opinion for PCT/JP2019/037882 dated Nov. 26, 2019.

*Primary Examiner* — Tuan T Dinh
(74) *Attorney, Agent, or Firm* — Pearne & Gordon LLP

(57) ABSTRACT

A module includes: a substrate having a main surface and a side surface; an electronic component mounted on the main surface; a sealing resin that covers the main surface and the electronic component; and a shield film that covers a surface of the sealing resin and the side surface of the substrate. The sealing resin includes: a resin component containing an organic resin as a main component; and a granular filler containing an inorganic oxide as a main component. On a surface of the sealing resin, which is in contact with the shield film, parts of some grains of the filler are exposed from the resin component, a surface of the resin component includes a nitrogen functional group, and the shield film is (Continued)

formed of a metal that is a passivation metal and a transition metal or an alloy containing the metal.

16 Claims, 14 Drawing Sheets

(51) Int. Cl.
      *H01L 21/56*       (2006.01)
      *H01L 23/29*       (2006.01)
      *H05K 3/28*        (2006.01)
      *H05K 9/00*        (2006.01)
      *H01L 23/498*     (2006.01)

(52) U.S. Cl.
      CPC ........... *H05K 3/284* (2013.01); *H05K 9/0088* (2013.01); *H01L 23/49838* (2013.01); *H05K 3/282* (2013.01); *H05K 2201/0919* (2013.01); *H05K 2201/10545* (2013.01); *H05K 2203/1322* (2013.01)

(58) Field of Classification Search
      CPC ........ H05K 9/00; H05K 9/002; H01L 23/292; H01L 23/552; H01L 23/3128; H01L 23/49805
      USPC ....... 361/760, 764, 782–784, 803, 816, 818; 174/520–525, 259–262; 257/685–730, 257/778–790
      See application file for complete search history.

(56) References Cited

U.S. PATENT DOCUMENTS

| | | | |
|---|---|---|---|
| 9,508,656 B2* | 11/2016 | Chiu | ................... H01L 23/3135 |
| 2013/0020119 A1* | 1/2013 | Yoshida | ............... H05K 1/0218 |
| | | | 174/260 |
| 2013/0155639 A1* | 6/2013 | Ogawa | ................... H05K 3/284 |
| | | | 29/841 |
| 2017/0033086 A1 | 2/2017 | Homma et al. | |
| 2018/0108618 A1 | 4/2018 | Yamamoto et al. | |
| 2020/0375022 A1* | 11/2020 | Nomura | ................... H01L 23/00 |

FOREIGN PATENT DOCUMENTS

| | | |
|---|---|---|
| JP | 2017-034086 A | 2/2017 |
| JP | 6331879 B2 | 5/2018 |
| WO | 2016/204208 A1 | 12/2016 |

* cited by examiner

MODULE AND METHOD FOR MANUFACTURING THE SAME

CROSS REFERENCE TO RELATED APPLICATIONS

This is a continuation of International Application No. PCT/JP2019/037882 filed on Sep. 26, 2019 which claims priority from Japanese Patent Application No. 2018-182554 filed on Sep. 27, 2018. The contents of these applications are incorporated herein by reference in their entireties.

BACKGROUND OF THE DISCLOSURE

Field of the Disclosure

The present disclosure relates to a module and a method for manufacturing the same.

Description of the Related Art

Japanese Unexamined Patent Publication No. 2016-219711 (Patent Document 1) describes a wiring board including an insulating resin layer. In Patent Document 1, a nitrogen functional group is present on the surface of the insulating resin layer, and the insulating resin layer and an underlying metal layer are in close contact with each other with the nitrogen functional group interposed therebetween. Patent Document 1 describes that the nitrogen functional group is formed on the surface of the insulating resin layer by treating the upper surface of the insulating resin layer with nitrogen plasma.

Japanese Patent No. 6331879 (Patent Document 2) describes an electronic device in which an electronic element is sealed with a mold member. A filler is exposed from a resin on the surface of the mold member composed of the resin and the filler, whereby an uneven surface is formed. Patent Document 2 describes that the formation of the uneven surface increases the surface area of the mold member, and makes it possible to improve the heat dissipation efficiency thereof.

Patent Document 1: Japanese Patent Application Laid-Open No. 2016-219711

Patent Document 2: Japanese Patent No. 6331879

BRIEF SUMMARY OF THE DISCLOSURE

Although Patent Document 1 describes as if the insulating resin layer and the underlying metal layer could be in close contact with each other with the nitrogen functional group interposed therebetween, not all metals are in close contact with the nitrogen functional group. Hence, the effect of improving close contact property is not always obtained.

Moreover, when a metal film is formed on the surface of such a sealing resin containing the filler, the close contact property is not sufficient only by the close contact between the nitrogen functional group in such a resin component and the metal film. Furthermore, as shown in Patent Document 2, in a configuration in which the filler is exposed from the sealing resin, in order for the metal film to be further stably fixed in place, it is necessary to bring the metal film not only into close contact with the resin component but also into close contact with the filler. However, heretofore, it has not been possible to bring the metal film into close contact with the resin component and the filler at the same time.

Therefore, it is an object of the present disclosure to provide a module capable of bringing a shield film into close contact with both the resin component and the filler, and to provide a method for manufacturing the same.

In order to achieve the above object, a module based on the present disclosure includes: a substrate having a main surface and a side surface; an electronic component mounted on the main surface; a sealing resin that covers the main surface and the electronic component; and a shield film that covers a surface of the sealing resin and the side surface of the substrate, wherein the sealing resin includes a resin component containing an organic resin as a main component and a granular filler containing an inorganic oxide as a main component, on a surface of the sealing resin, the surface being in contact with the shield film, parts of some grains of the filler are exposed from the resin component, a surface of the resin component includes a nitrogen functional group, and the shield film is formed of a metal that is a passivation metal and also is a transition metal or an alloy containing the metal.

According to the present disclosure, the shield film can be brought into close contact with both the resin component and the filler.

DETAILED DESCRIPTION OF THE DISCLOSURE

Figure 1:
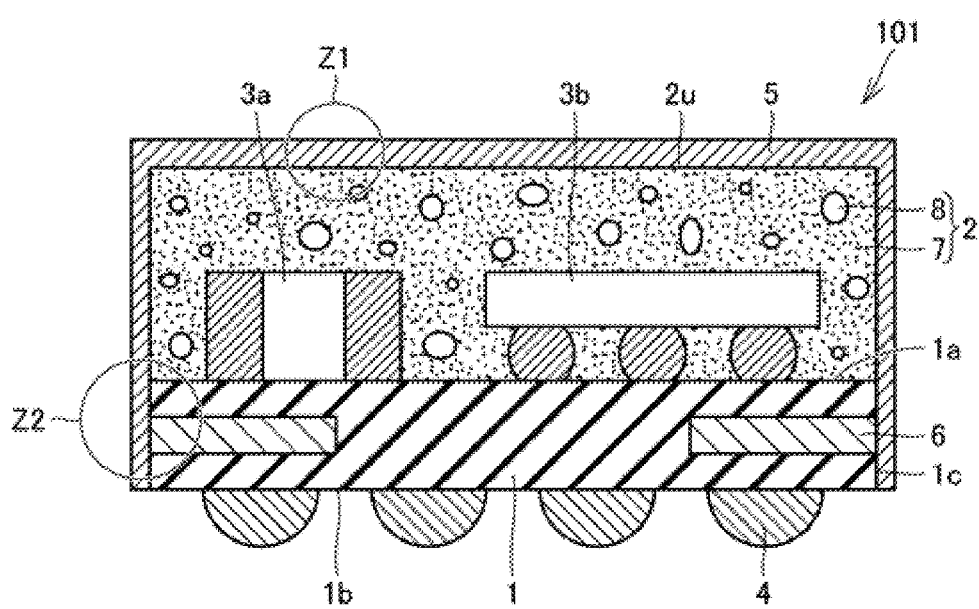
FIG. 1 is a sectional view of a module in a first embodiment based on the present disclosure.

Dimensional ratios shown in the drawings do not always faithfully represent an actual situation, and the dimensional ratios may be shown in an exaggerated manner for convenience of explanation. In the following description, when a concept of "up" or "down" is referred to, the concept does not necessarily mean an absolute up or down, but may mean relative up or down in an illustrated posture.

First Embodiment

Figure 2:
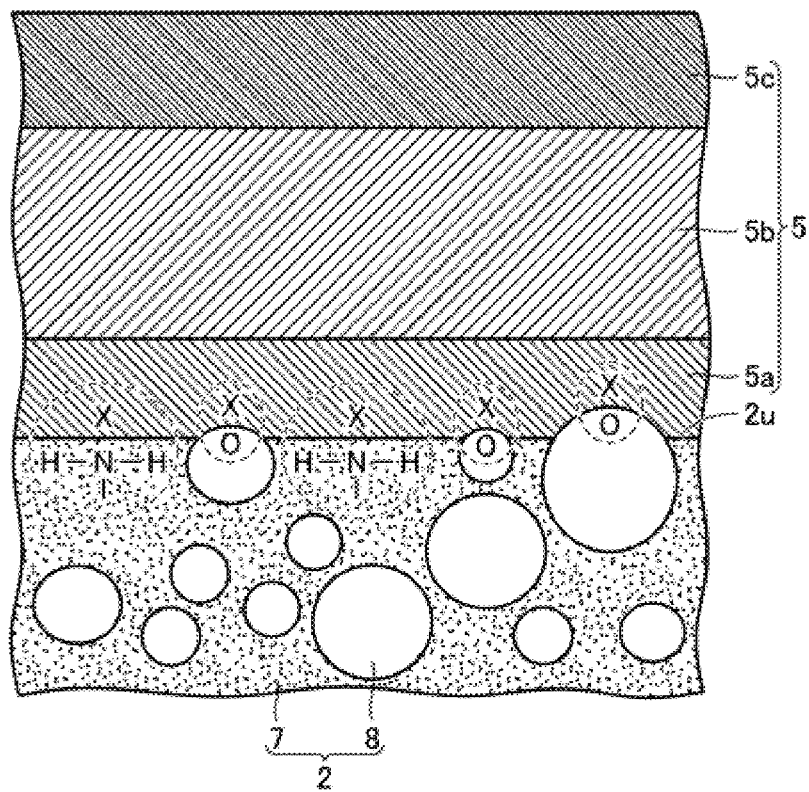
FIG. 2 is an enlarged view of a Z1 portion in FIG. 1.
Figure 3:
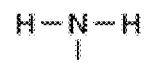
FIG. 3 is a diagram illustrating the structure of a nitrogen functional group.
Figure 4:
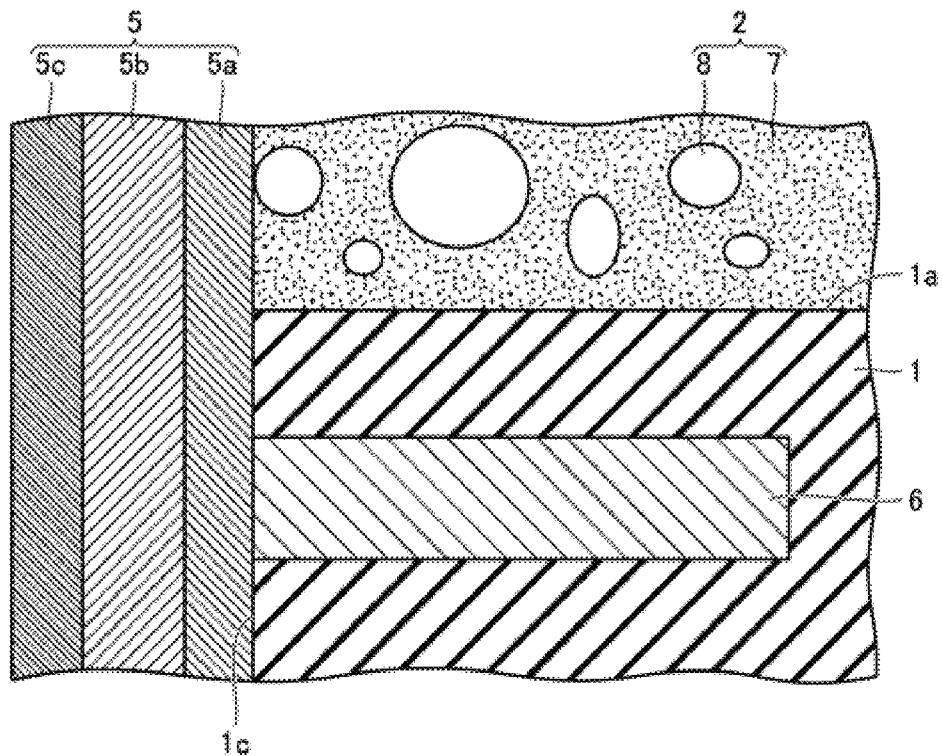
FIG. 4 is an enlarged view of a Z2 portion in FIG. 1.

Referring to FIGS. 1 to 4, a description will be given of a module in a first embodiment based on the present disclosure. FIG. 1 illustrates a sectional view of a module 101 in the present embodiment. The module 101 includes a substrate 1, electronic components 3a and 3b, a sealing resin 2, and a shield film 5. FIG. 2 illustrates an enlarged view of a Z1 portion in FIG. 1. FIG. 3 illustrates a nitrogen functional group. "X" in the drawing means an atom of a metal that is a passivation metal and also is a transition metal. "O" in the drawing means an oxygen atom. FIG. 4 illustrates an enlarged view of a Z2 portion in FIG. 1.

The module 101 includes: the substrate 1 having a main surface 1a and a side surface 1c; the electronic components 3a and 3b mounted on the main surface 1a of the substrate 1; the sealing resin 2 that covers the main surface 1a and the electronic components 3a and 3b; and a shield film 5 that covers the surface of the sealing resin 2 and the side surface 1c of the substrate 1. The substrate 1 may be a ceramic substrate or a resin substrate. Here, an example in which a plurality of electronic components are mounted on the main surface 1a is illustrated; however, a configuration in which only one electronic component is mounted on the main surface 1a may be adopted. The sealing resin 2 includes: a resin component 7 containing an organic resin as a main component; and a granular filler 8 containing an inorganic oxide as a main component. The term "containing as a main component" as used herein refers to a state in which a content accounts for a half or more in terms of a weight ratio. In the present embodiment, the resin component is composed of an organic resin, and the filler is composed of an inorganic oxide. Moreover, the organic resin as used herein may be, for example, an epoxy resin. The inorganic oxide that constitutes the filler 8 is, for example, $SiO_2$. As illustrated in FIG. 2, on the surface of the sealing resin 2, which is in contact with the shield film 5, parts of some grains of the filler 8 are exposed from the resin component 7. Unexposed portions are embedded in the resin component 7. The surface of the resin component 7 contains a nitrogen functional group. The nitrogen functional group is as illustrated in FIG. 3. The shield film 5 is formed of a metal that is a passivation metal and also is a transition metal, or of an alloy containing the metal. The term "passivation metal" as used herein means a metal that easily forms a passivation state.

In the example shown here, the shield film 5 includes a close contact layer 5a on a surface thereof in contact with the sealing resin 2. The shield film 5 has a three-layer structure composed of the close contact layer 5a, a conductive layer 5b, and an anticorrosive layer 5c.

In the present embodiment, the shield film 5 includes the close contact layer 5a on the contact surface with the sealing resin 2, and the close contact layer 5a is formed of the metal that is a passivation metal and also is a transition metal or the alloy containing the metal. Therefore, the shield film 5 can be brought into close contact with both the resin component 7 and filler 8 of the sealing resin 2 according to a principle to be described later.

First, such a principle that the close contact layer 5a and the filler 8 are brought into close contact with each other will be described. For this, the properties of the close contact layer 5a as a passivation metal are utilized. The material of the close contact layer 5a is brought into close contact with the filler 8 by binding with oxygen contained in the filler 8. The material of the close contact layer 5a is oxidized by binding with oxygen, and forms a passivation state as a result. Since the oxidized material of the close contact layer 5a has a passivation state, the oxidation is limited to a depth of several nanometers to several tens of nanometers, and does not proceed any further. Hence, strong close contact with high reliability can be obtained. Note that the close contact between the resin component 7 made of an epoxy resin and the filler 8 can be ensured by embedding the portions of the filler 8, which are other than the exposed portions, in the resin component 7.

Next, such a principle that the close contact layer 5a and the resin component 7 are brought into close contact with each other will be described. For this, the properties of the close contact layer 5a as a transition metal are utilized. Before forming the close contact layer 5a, the nitrogen functional group is formed in advance on the surface of the epoxy resin component of the resin component 7, that is, of the resin component 7. Since the transition metal has a property of coordinating with the nitrogen functional group, the material of the close contact layer 5a is brought into close contact with the nitrogen functional group of the resin component 7 by such a coordination bond.

As illustrated in FIG. 4, preferably, the substrate 1 has an electrode 6 built therein so that the electrode 6 is exposed on the side surface 1c, and the electrode 6 and the close contact layer 5a are electrically connected to each other on the side surface 1c. This can be achieved by preventing the exposed electrode 6 from being over-nitrided. The electrode 6 may be, for example, a GND electrode. Since the electrode 6 and the close contact layer 5a are electrically connected to each other on the side surface 1c of the substrate 1, the electrode 6 and the shield film 5 can be caused to have the same potential. In particular, when the electrode 6 is such a GND electrode, an internal space surrounded by the shield film 5 can be well shielded.

(Manufacturing method) A method for manufacturing the module according to the present embodiment will be described. The method for manufacturing the module in the present embodiment includes: a step of preparing the substrate 1 having the main surface 1a and the side surface 1c, and having the electronic components mounted on the main surface 1a; a step of forming the sealing resin 2 so that the sealing resin 2 covers the main surface 1a and the electronic components; a step of applying nitrogen ions to a surface of the sealing resin 2 and the side surface 1c of the substrate 1; and a step of forming the shield film 5 so that the shield film 5 covers the surface of the sealing resin 2 and the side surface 1c of the substrate 1, wherein the sealing resin 2 includes the resin component 7 containing an organic resin as a main component and the granular filler 8 containing an inorganic oxide as a main component, the shield film 5 includes the close contact layer 5a on a surface being in contact with the sealing resin 2, on the surface of the sealing resin 2, the surface being in contact with the close contact layer 5a, parts of some grains of the filler 8 are exposed from the resin component 7, and the close contact layer 5a is formed of a metal that is a passivation metal and also is a transition metal, or of an alloy containing the metal. The organic resin that constitutes the resin component 7 may be, for example, an epoxy resin. Each of the above-mentioned steps will be described with reference to the drawings.

Figure 5:
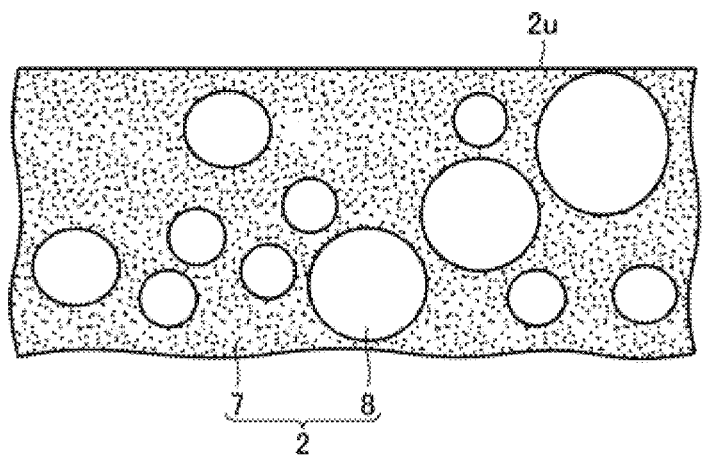
FIG. 5 is an enlarged sectional view of the Z1 portion in a first step of a method for manufacturing the module in the first embodiment based on the present disclosure.

It is assumed that the sealing resin 2 has already been formed and the shield film 5 has not yet been formed. The sealing resin 2 covers some electronic components mounted on the main surface 1a of the substrate 1. FIG. 5 illustrates an enlarged view of the upper surface of the sealing resin 2, that is, a portion corresponding to the Z1 portion in FIG. 1. Almost all of each grain of the filler 8 is embedded in the resin component 7, and the upper surface 2u of the sealing resin 2 is almost flat. As the filler 8, there are spherical grains with a variety of sizes, which are randomly located inside the sealing resin 2. At this point of time, spots where the filler 8 protrudes from the upper surface 2u are hardly present.

Figure 6:
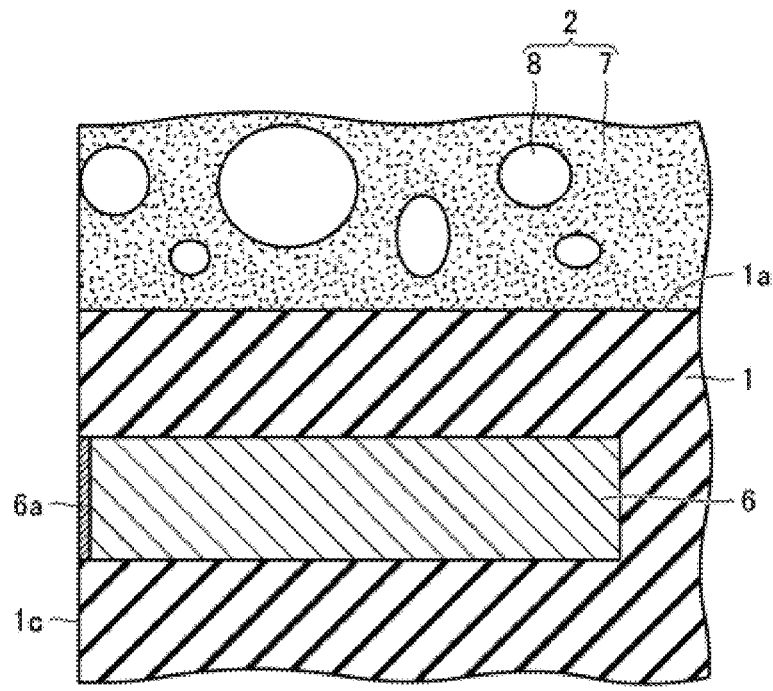
FIG. 6 is an enlarged sectional view of the Z2 portion in the first step of the method for manufacturing the module in the first embodiment based on the present disclosure.

FIG. 6 illustrates an enlarged portion of a spot where the electrode 6 is exposed on the side surface 1c of the substrate 1, that is, of a portion corresponding to the Z2 portion in FIG. 1. An oxide film 6a is formed on the exposed portion of the electrode 6. The oxide film 6a is formed in such a manner that a material of the electrode 6 reacts with oxygen in the air.

Hereinafter, in a structure being manufactured too, the portions corresponding to the Z1 portion and the Z2 portion in FIG. 1 will be simply referred to as "Z1 portion" and "Z2 portion", respectively. The description will continue while paying attention to a state of these two spots. Similar names are used in other embodiments.

Figure 7:
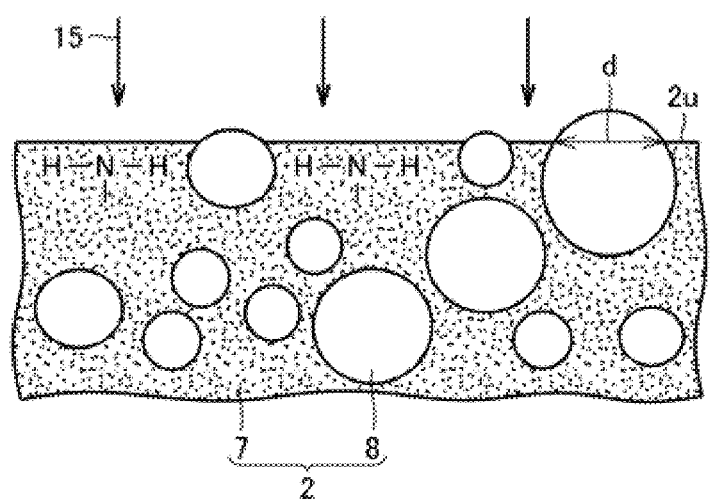
FIG. 7 is an enlarged sectional view of the Z1 portion in a second step of the method for manufacturing the module in the first embodiment based on the present disclosure.

Next, nitrogen ions are applied. The Z1 portion is in a state as illustrated in FIG. 7. That is, the surface layer portion of the sealing resin 2 is removed by etching with nitrogen ions 15 thus applied. Since an etching rate of the resin component 7 is higher than that of the filler 8, the resin component 7 is selectively removed by etching. As a result, some grains of the filler 8 embedded in the resin component 7 are exposed from the resin component 7. In portions from which the grains of the filler 8 are exposed, a part of each grain is in a state of protruding from the resin component 7. In the grains having exposed parts too, the other portion of each of the grains is in a state of being embedded in the resin component 7. The application of the nitrogen ions 15 not only etches the resin component 7 but also modifies such an epoxy resin component of the resin component 7 at the same time, and the nitrogen functional group is generated on the surface thereof.

Figure 8:
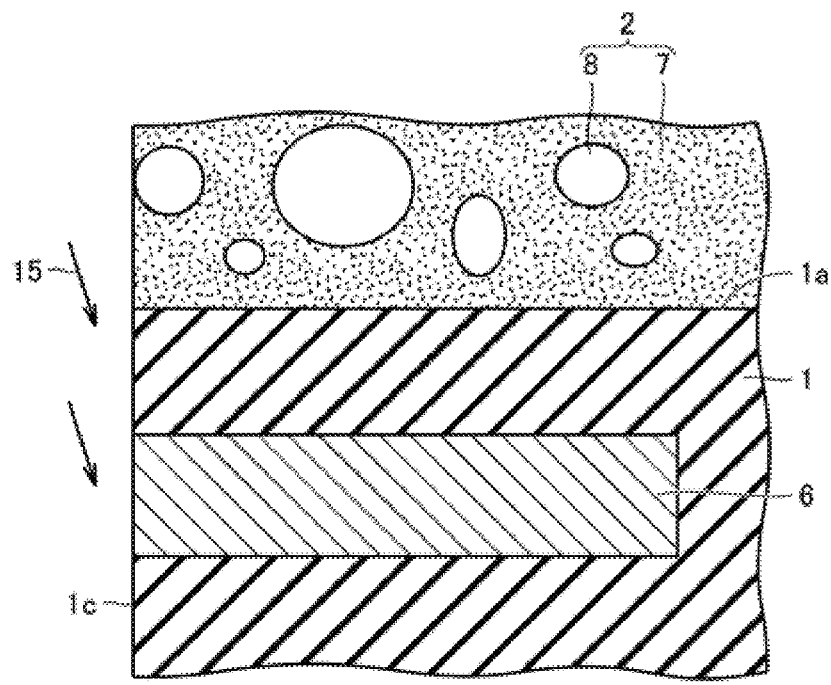
FIG. 8 is an enlarged sectional view of the Z2 portion in the second step of the method for manufacturing the module in the first embodiment based on the present disclosure.

When the nitrogen ions 15 are applied, the Z2 portion is as illustrated in FIG. 8. That is, the oxide film 6a is removed from the electrode 6. However, when it is desired to avoid the formation of a nitride film on the exposed surface of the electrode 6, desirably, an ion irradiation source should be installed apart from the module, nitrogen should not be actively introduced into the inside of a chamber, and the module should not be exposed in a nitrogen atmosphere excessively. In such a way, it is possible to avoid the exposed electrode 6 from being nitrided excessively, and accordingly, it is possible to avoid a close contact property of the shield film which will be described later from being impaired.

Regarding the application of the nitrogen ions, when it is possible to select a condition in which a nitrogen functional group generation rate is higher than the etching rate, it is possible to perform a treatment under only the one way of condition; however, the treatment may be performed by a method of combining plural ways of conditions with one another and sequentially switching the combined conditions. For example, there may be performed such a treatment divided into a plurality of steps that a treatment is initially performed under a condition where the etching rate is high and a treatment is then performed under a condition where the nitrogen functional group generation rate is high.

Alternatively, the treatment may be a treatment in which an etching treatment is initially performed by the application of Ar ions and the nitrogen functional group is then generated by the application of the nitrogen ions. The nitrogen functional group is also generated on the surface of the resin component 7, which is exposed on the side surface of the sealing resin 2.

Figure 9:
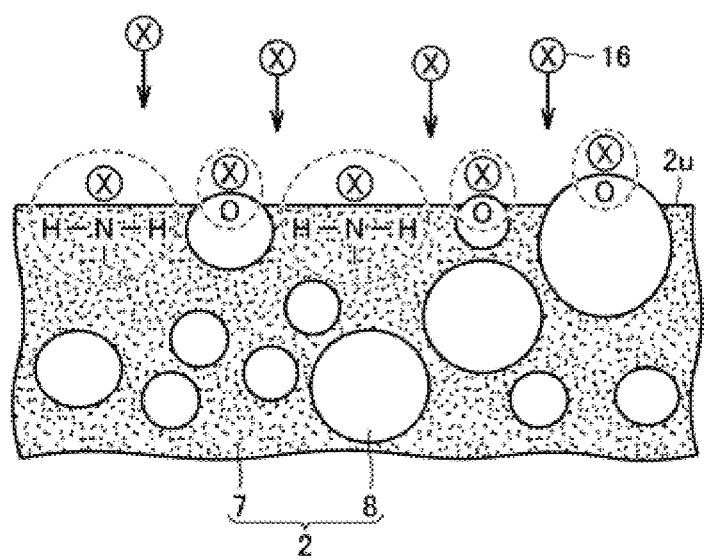
FIG. 9 is an enlarged sectional view of the Z1 portion in a third step of the method for manufacturing the module in the first embodiment based on the present disclosure.

Next, the close contact layer 5a is formed as a part of the shield film 5. For that purpose, a metal X, which serves as a material of the close contact layer 5a, is subjected to close contact by sputtering or vapor deposition. In the Z1 portion, as illustrated in FIG. 9, metal particles 16 fly and adhere to the surface of the sealing resin 2. However, the metal X is selected from among metals which are passivation metals and transition metals, or among alloys containing the metals. The term "passivation metals" as used herein means metals which easily form passivationstates. Examples of the metals which are passivation metals and transition metals include Ti, Cr, Ni, and Mo. The alloys containing any of these include, for example, SUS. With the filler 8, the metal X binds with the oxygen in the filler 8. Moreover, with the epoxy resin component of the resin component 7, the metal X binds with the nitrogen functional group generated on the surface thereof. When the metal X is SUS, Cr or Ni contained in SUS contributes to the close contact. In this way, the close contact layer 5a can be brought into close contact with two different materials at the same time.

Figure 10:
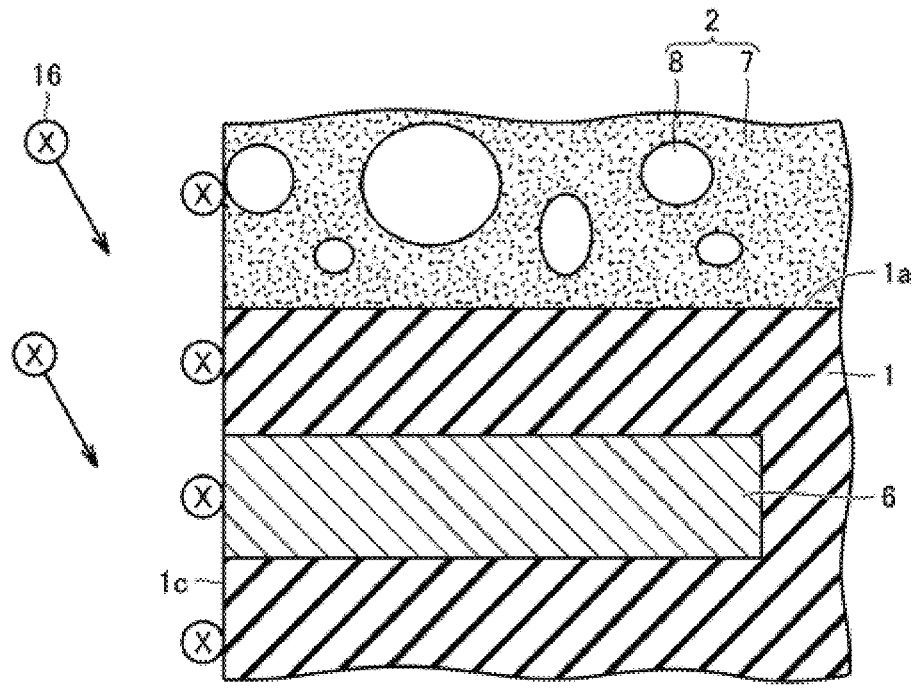
FIG. 10 is an enlarged sectional view of the Z2 portion in the third step of the method for manufacturing the module in the first embodiment based on the present disclosure.

In the Z2 portion, as illustrated in FIG. 10, the metal X that is the material of the close contact layer 5a adheres to the side surface 1c. The oxide film on the surface of the electrode 6 has already been removed, and accordingly, the metal X directly adheres to the material of the electrode 6.

Figure 11:
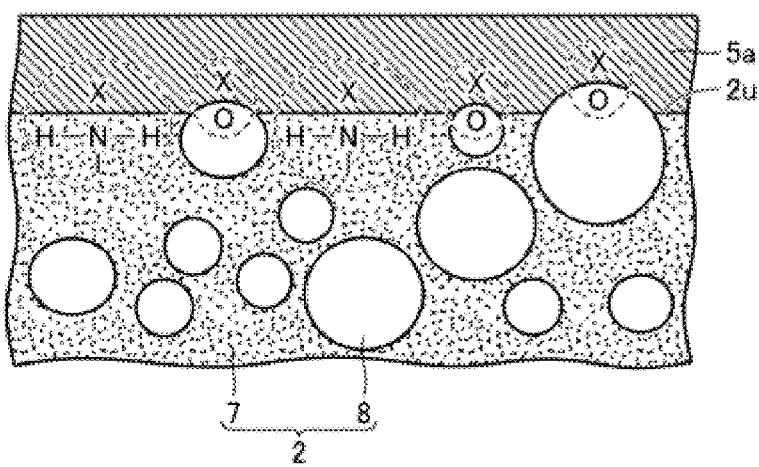
FIG. 11 is an enlarged sectional view of the Z1 portion in a fourth step of the method for manufacturing the module in the first embodiment based on the present disclosure.
Figure 12:
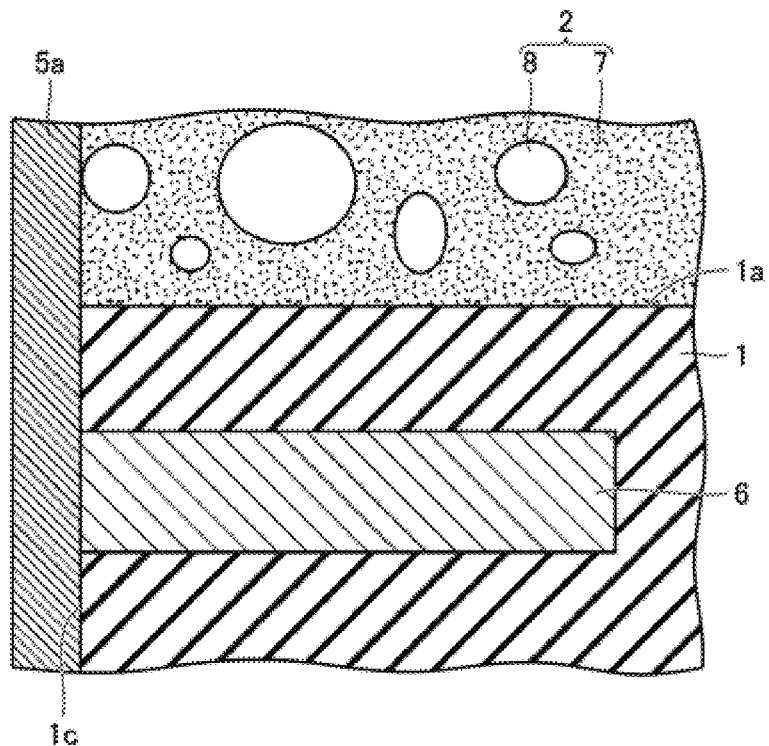
FIG. 12 is an enlarged sectional view of the Z2 portion in the fourth step of the method for manufacturing the module in the first embodiment based on the present disclosure.

As a result of continuing the adhesion of the metal X, the close contact layer 5a is formed in the Z1 portion as illustrated in FIG. 11. In the Z2 portion, the close contact layer 5a is formed as illustrated in FIG. 12.

Figure 13:
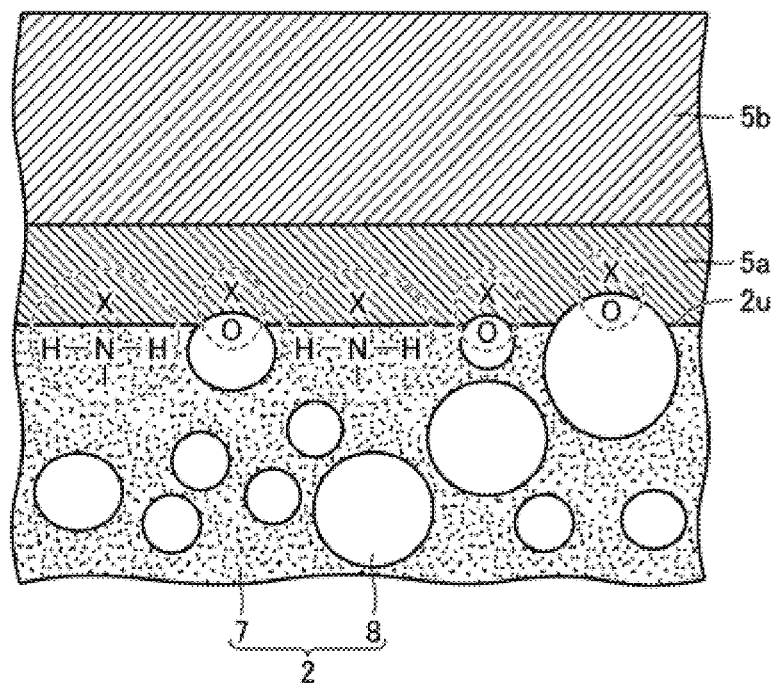
FIG. 13 is an enlarged sectional view of the Z1 portion in a fifth step of the method for manufacturing the module in the first embodiment based on the present disclosure.
Figure 14:
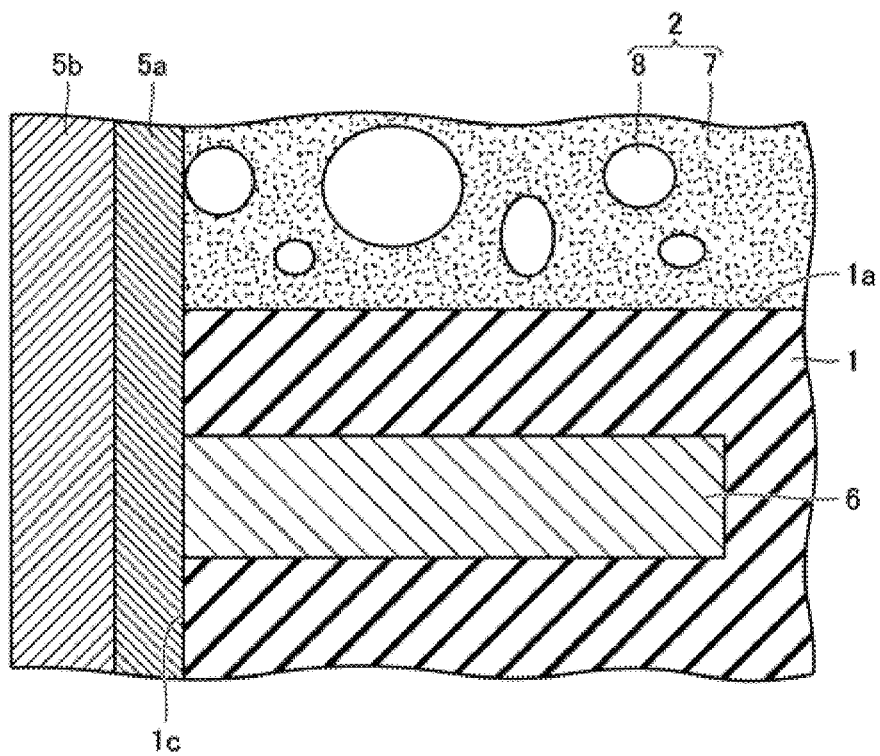
FIG. 14 is an enlarged sectional view of the Z2 portion in the fifth step of the method for manufacturing the module in the first embodiment based on the present disclosure.

The conductive layer 5b is formed so as to cover the close contact layer 5a. In the Z1 portion, the conductive layer 5b is formed as illustrated in FIG. 13. In the Z2 portion, the conductive layer 5b is formed as illustrated in FIG. 14. As a material of the conductive layer 5b, a metal material having a low resistivity is preferable. The material of the conductive layer 5b may be, for example, Cu.

The anticorrosive layer 5c may be further formed so as to cover the conductive layer 5b. By forming the anticorrosive layer 5c, the structure illustrated in FIGS. 1, 2 and 4 is obtained. A material of the anticorrosive layer 5c is desirably a passivation metal. The material of the anticorrosive layer 5c may be the same as the material of the close contact layer 5a.

Figure 15:
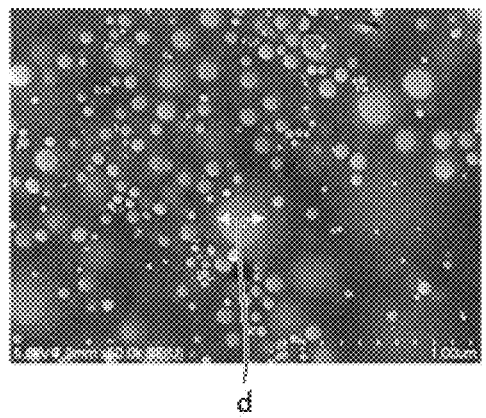
FIG. 15 is a first photograph of the surface of a sealing resin 2 after irradiation treatment with nitrogen ions.
Figure 16:
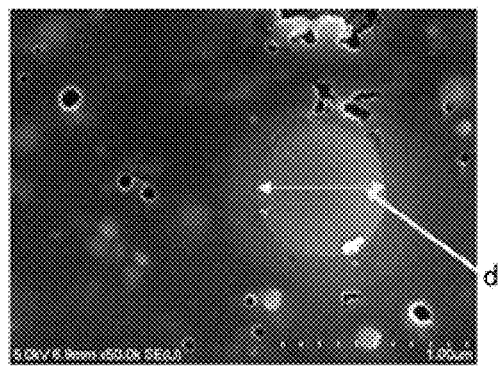
FIG. 16 is a second photograph of the surface of the sealing resin 2 after the irradiation treatment with nitrogen ions.

FIGS. 15 and 16 show field emission-scanning electron microscope (FE-SEM) images of the surface of the sealing resin 2 after irradiation treatment with the nitrogen ions. FIG. 15 shows an example in which a blending amount of the filler 8 is larger than that of the resin component 7. FIG. 16 shows an example in which a blending amount of the filler 8 is smaller than that of the resin component 7. An application time of the nitrogen ions is preferably 3 to 15 minutes from a viewpoint of achieving both cost and effectiveness. FIGS. 15 and 16 show photographs of the surface of the sealing resin 2 etched to a depth of approximately 3 µm under this condition when viewed from a vertical direction. In the sealing resin 2, mixed are filler grains having a variety of grain sizes ranging from 10 nm or more to 30 µm or less. The blending amount of the filler is 70% by weight or more and 95% by weight or less with respect to the total resin components of the sealing resin. In the examples shown in FIGS. 15 and 16, the diameter d of the exposed portion of the filler 8 is 10 nm or more and 700 nm or less. The grains of the filler 8 having a small diameter may fall off from the sealing resin 2 during the treatment; however, this is not a problem because the grains can be removed from the surface of the sealing resin 2 by applying vibration thereto, and so on.

Figure 17:
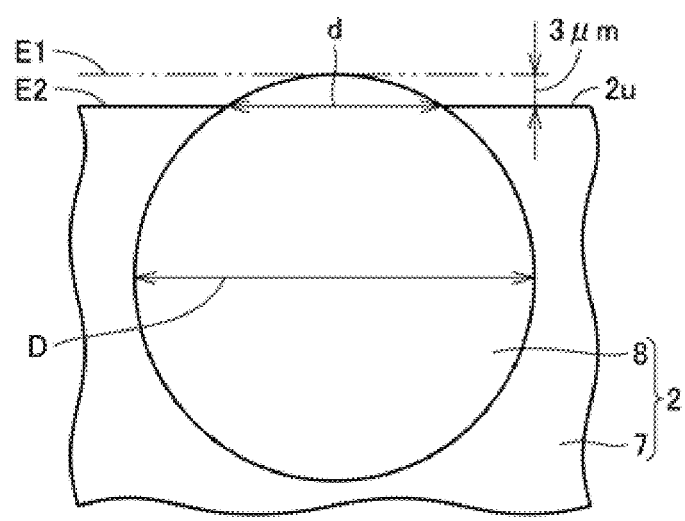
FIG. 17 is an enlarged sectional view of a grain of a filler and a vicinity thereof.

Focusing on one of the grains of the filler 8, which are shown in FIG. 15 or 16, FIG. 17 shows an enlarged sectional view of the grain and the vicinity thereof. As compared with a surface E1 before irradiation with the nitrogen ions, a surface E2 after etching with irradiation is lower by approximately 3 µm. Here, the filler 8 having a diameter D of 30 µm is displayed. A diameter d of a portion of the grain, which is exposed after etching, is 20 µm. Such a diameter of the exposed portion of the filler 8, which is exposed on the surface of the sealing resin 2, is preferably 10 nm or more and 20 µm or less.

Second Embodiment

Figure 18:
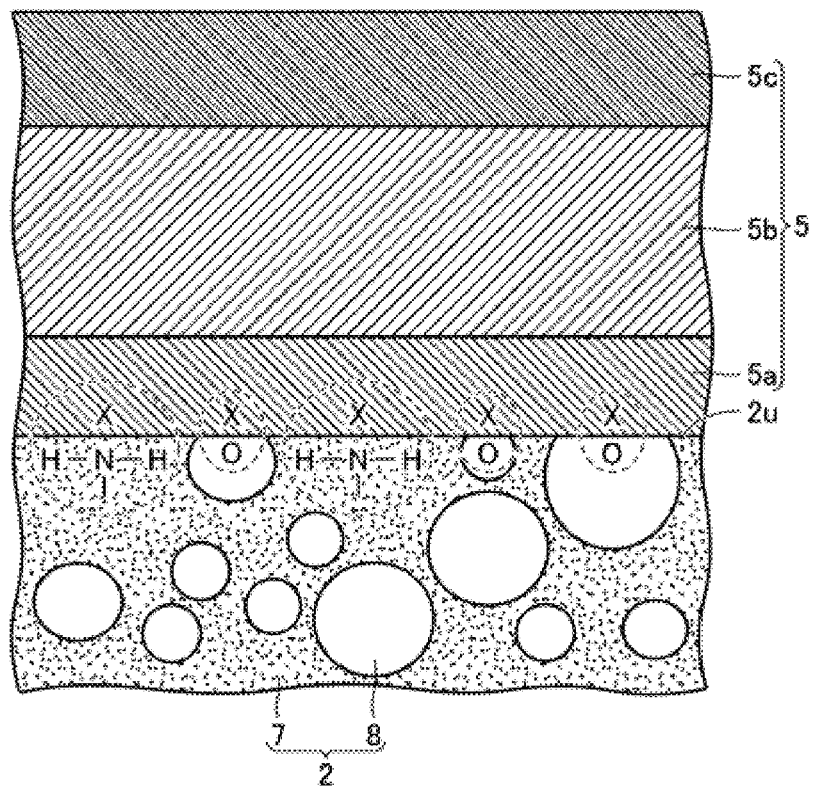
FIG. 18 is an enlarged view of a Z1 portion of a module in a second embodiment based on the present disclosure.

Referring to FIG. 18, a description will be given of a module in a second embodiment based on the present disclosure. The basic configuration of the module in the present embodiment is the same as that described in the first embodiment. In the module in the present embodiment, a state of the surface 2u of the sealing resin 2 is different from that in the first embodiment. FIG. 18 illustrates an enlarged sectional view of a part of a Z1 portion.

In the present embodiment, the exposed surfaces of the grains are flat at the spots where the grains of the filler 8 are exposed from the resin component 7. That is, on the surface 2u of the sealing resin 2, a protrusion amount of the filler 8 is smaller than that of the first embodiment, and the surface 2u is substantially flat. The module having such a surface 2u can be obtained by additionally including the following steps in the manufacturing method described in the first embodiment.

The method for manufacturing the module in the present embodiment includes a step of flattening the exposed portions of the grains of the filler 8 by grinding or polishing the surface 2u of the sealing resin 2, in which parts of the grains of the filler 8 are exposed from the resin component 7. Such a flattening step is preferably performed before the step of applying the nitrogen ions. By including such a step, portions where the filler 8 protrudes can be removed to flatten the exposed surfaces of the filler 8. In FIG. 18, the exposed surfaces of the filler 8 are displayed as if being flush with the exposed surface of the resin component 7 on the surface 2u of the sealing resin 2; however, the exposed surfaces of the filler 8 may slightly protrude from the exposed surface of the resin component 7. An occurrence of such a step difference is due to the fact that the filler 8 is harder than the resin component 7 and difficult to scrape, and that the etching rate of the filler 8 with ions is lower than the etching rate of the resin component 7 with ions.

In the present embodiment, the surface 2u of the sealing resin 2 is ground or polished as a step of flattening the exposed portions of the grains of the filler 8, and accordingly, the diameter of the exposed portions of the filler 8 can be easily increased, and an area in which the filler 8 and the close contact layer 5a are in close contact with each other can be increased easily.

For example, when the diameter D of the filler 8 is 30 µm, long-term ion gun irradiation is required to set the diameter d of the exposed portion to 30 µm by etching by the irradiation with the nitrogen ions. However, as described in the present embodiment, when adopted is such a method of increasing the diameter of the exposed portions of the filler 8 by grinding or polishing the surface 2u of the sealing resin 2, the long-term ion gun irradiation is not required, and the diameter of the exposed portions of the filler 8 can be easily increased to a desired size. It is also easily possible to set the diameter of the exposed portions to 30 µm.

Third Embodiment

Figure 19:
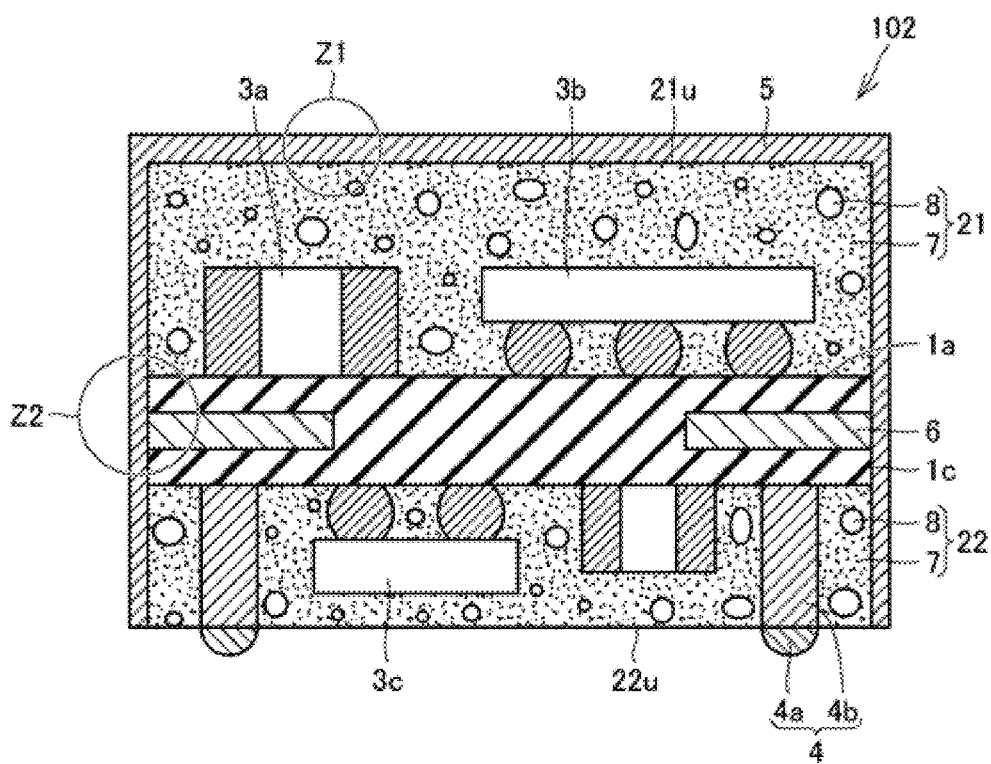
FIG. 19 is a sectional view of a module in a third embodiment based on the present disclosure.

Referring to FIG. 19, a description will be given of a module in a third embodiment based on the present disclosure. The basic configuration of the module in the present embodiment is the same as that described in the first embodiment. In the module in the present embodiment, the following point is different from that in the first embodiment. In the present embodiment, some components are mounted on both surfaces of the substrate 1. In the present embodiment, the sealing resin is formed on both surfaces of the substrate 1. FIG. 19 illustrates a sectional view of a module 102 in the present embodiment.

The module 102 in the present embodiment includes: a substrate 1 having a main surface 1a as a first main surface, a main surface 1b as a second main surface present on an opposite side to the first main surface, and a side surface 1c; electronic components mounted on the first main surface and the second main surface; a first sealing resin 21 that covers the first main surface and the electronic components mounted on the first main surface; a second sealing resin 22 that covers the second main surface and the electronic components mounted on the second main surface; and a shield film 5 as a first shield film that covers a surface 21u of the first sealing resin 21, the side surface 1c of the substrate 1, and a side surface of the second sealing resin 22. The first sealing resin 21 includes: the resin component 7 containing an organic resin as a main component; and the granular filler 8 containing an inorganic oxide as a main component. On the surface 21u of the first sealing resin 21, which is in contact with the shield film 5 as the first shield film, parts of some grains of the filler 8 are exposed from the resin component 7. The surface of the resin component 7 contains a nitrogen functional group. The first shield film is formed of a metal that is a passivation metal and also is a transition metal, or of an alloy containing the metal. A component 3c is mounted on the main surface 1b of the substrate 1. The component 3c is covered with the second sealing resin 22. The second sealing resin 22 has a surface 22u. The surface 22u is exposed. Columnar conductors 4b are installed on the main surface 1b of the substrate 1. Solder bumps 4a are connected to ends of the columnar conductors 4b, which are on the opposite side to the substrate 1. Each of external terminals 4 includes the solder bump 4a and the columnar conductor 4b. The solder bump 4a protrudes from the second sealing resin 22. The columnar conductor 4b is arranged so as to penetrate the second sealing resin 22. The organic resin that constitutes the resin component 7 may be, for example, an epoxy resin. The first shield film preferably includes the close contact layer 5a on a surface thereof in contact with the first sealing resin 21. The columnar conductor may be formed of a protruding electrode, a metal pin, plating or the like. Alternatively, a solder bump may be used instead of the columnar conductor.

In FIG. 19, since a breakdown of the shield film 5 is not displayed in detail, the close contact layer 5a is not displayed. However, enlarged sectional views of parts of the Z1 portion and the Z2 portion are similar to those illustrated in FIGS. 2 and 4, respectively. On the upper surface of the first sealing resin 21, parts of the grains of the filler 8 protrude as illustrated in FIG. 2.

In the present embodiment too, similar effects to those described in the first embodiment can be obtained.

A first modified example of the module in the present embodiment may be the one in which a state of the upper surface of the first sealing resin 21 is as illustrated in FIG. 18. That is, as illustrated in FIG. 18, exposed portions of the grains of the filler 8 may be flat on the upper surface of the first sealing resin 21.

Figure 20:
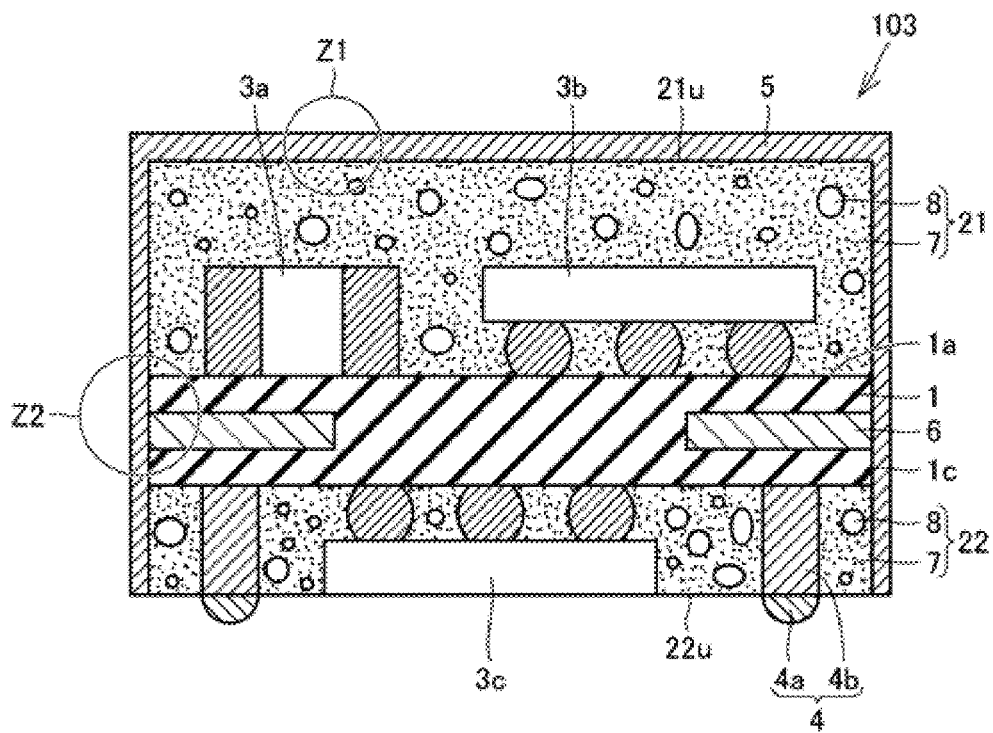
FIG. 20 is a sectional view of a modified example of the module in the third embodiment based on the present disclosure.

A second modified example of the module in the present embodiment may be the one like a module 103 illustrated in FIG. 20. The lower surface of the component 3c mounted on the main surface 1b is exposed from the second sealing resin 22. The second sealing resin 22 is thinner in the module 103 than in the module 102. A state of the upper surface of the first sealing resin 21 may be the one illustrated in FIG. 2 or the one illustrated in FIG. 18.

Fourth Embodiment

Figure 21:
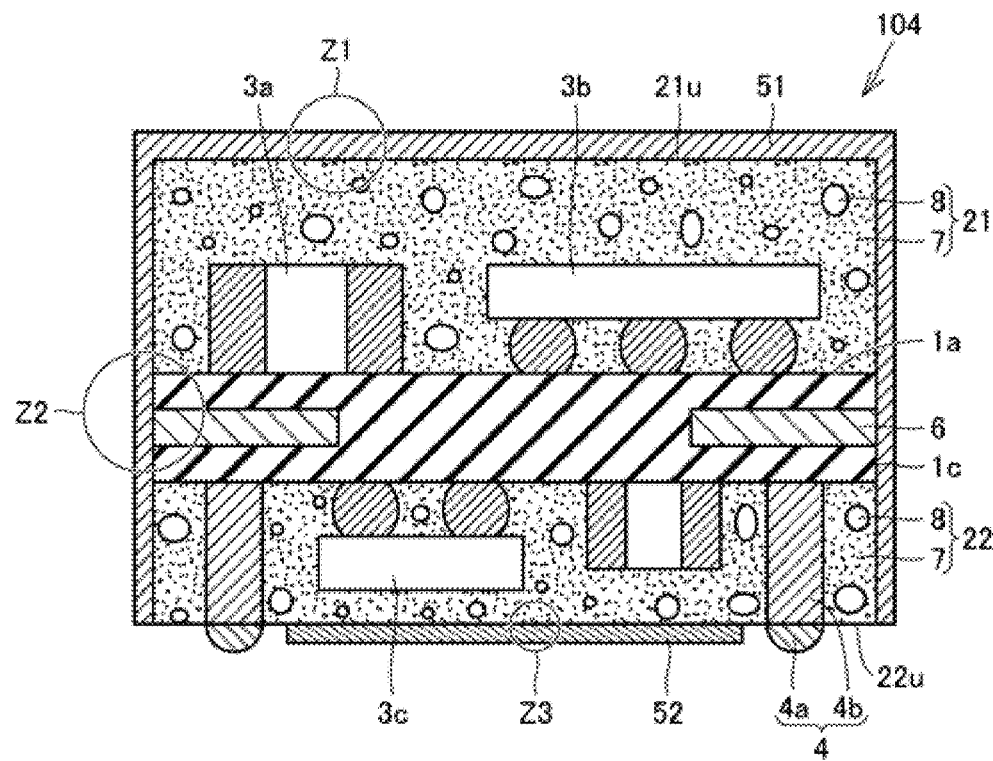
FIG. 21 is a sectional view of a module in a fourth embodiment based on the present disclosure.

Referring to FIG. 21, a description will be given of a module in a fourth embodiment based on the present disclosure. The basic configuration of the module in the present embodiment is the same as that described in the third embodiment. In the module in the present embodiment, the following point is different from that in the third embodiment.

FIG. 21 illustrates a sectional view of a module 104 in the present embodiment. The module 104 includes a first shield 51 and a second shield 52. The first shield 51 covers the upper surface and side surface of the first sealing resin 21, further covers the side surface 1c of the substrate 1, and further covers the side surface of the second sealing resin 22. The module in the present embodiment includes the second shield film 52 that covers a part of the surface 22u of the second sealing resin 22.

Figure 22:
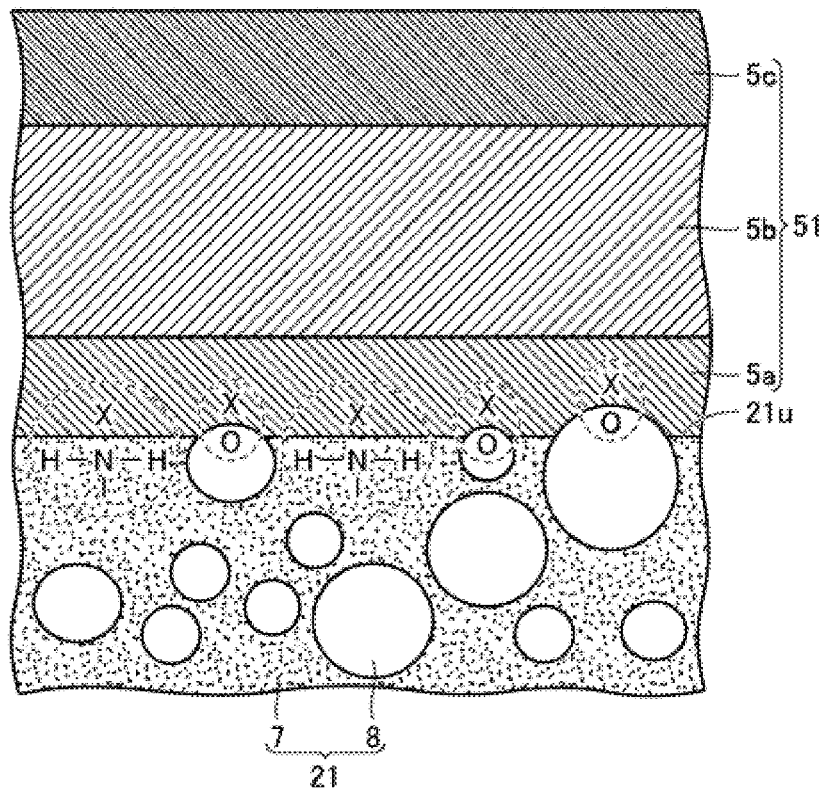
FIG. 22 is an enlarged view of a Z1 portion in FIG. 21.
Figure 23:
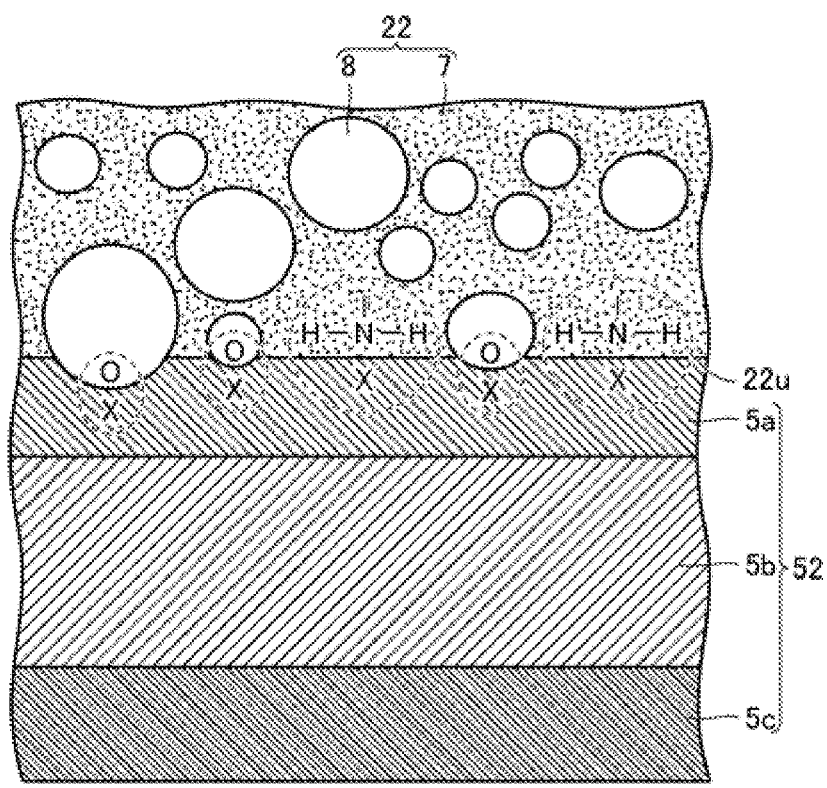
FIG. 23 is an enlarged view of a Z3 portion in FIG. 21.

FIG. 22 illustrates a Z1 portion in FIG. 21, which is enlarged. A part of the filler 8 contained in the first sealing resin 21 is exposed and protrudes from the resin component 7. A Z2 portion that is enlarged is similar to that in FIG. 4. FIG. 23 illustrates a Z3 portion, which is enlarged. On the surface of the second sealing resin 22, which is in contact with the close contact layer 5a of the second sealing resin 22, parts of some grains of the filler 8 contained in the second sealing resin 22 are exposed from the resin component 7. In the example illustrated here, some grains of the filler 8 are protruding. The external terminals 4 are arranged at positions away from the second shield 52. The second shield 52 may be electrically connected to the first shield 51. As a method of electrically connecting the second shield 52 to the first shield 51, for example, a part of the second shield 52 may be extended through between the external terminals 4 until reaching the first shield 51. The material of the second shield 52 may be the same as or different from the material of the first shield 51. The second shield film 52 preferably includes the close contact layer 5a on a surface thereof in contact with the second sealing resin 22.

In the present embodiment too, similar effects to those described in the first embodiment can be obtained. In the present embodiment, the second shield film 52 is provided in addition to the first shield film 51, but the close contact layer 5a and the second sealing resin 22 can be sufficiently brought into close contact with each other also regarding the second shield film 52.

Figure 24:
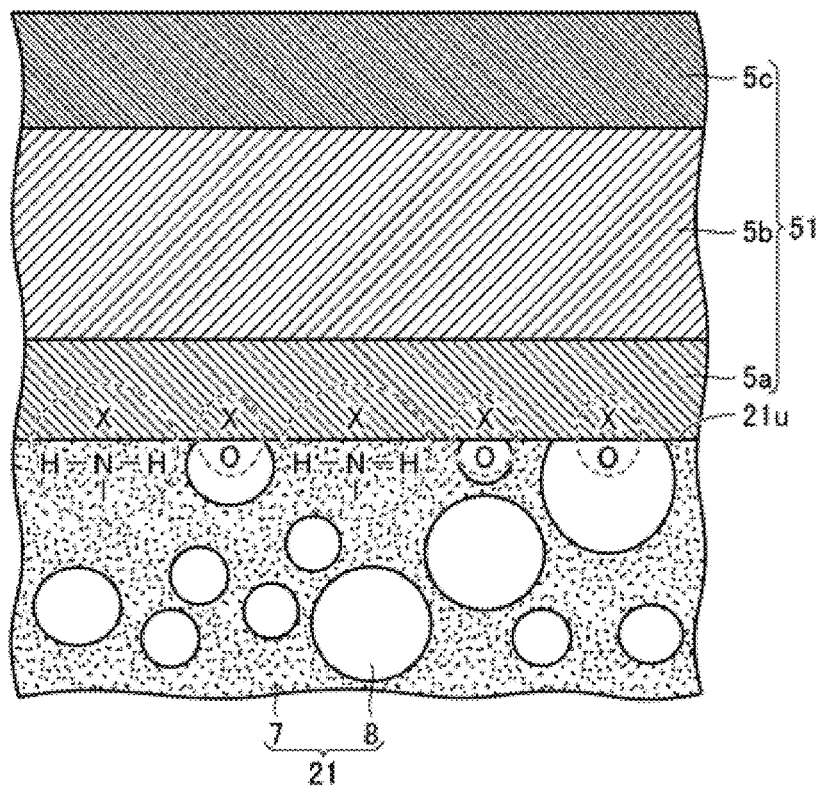
FIG. 24 is an enlarged sectional view of a Z1 portion of a first modified example of the module in the fourth embodiment based on the present disclosure.
Figure 25:
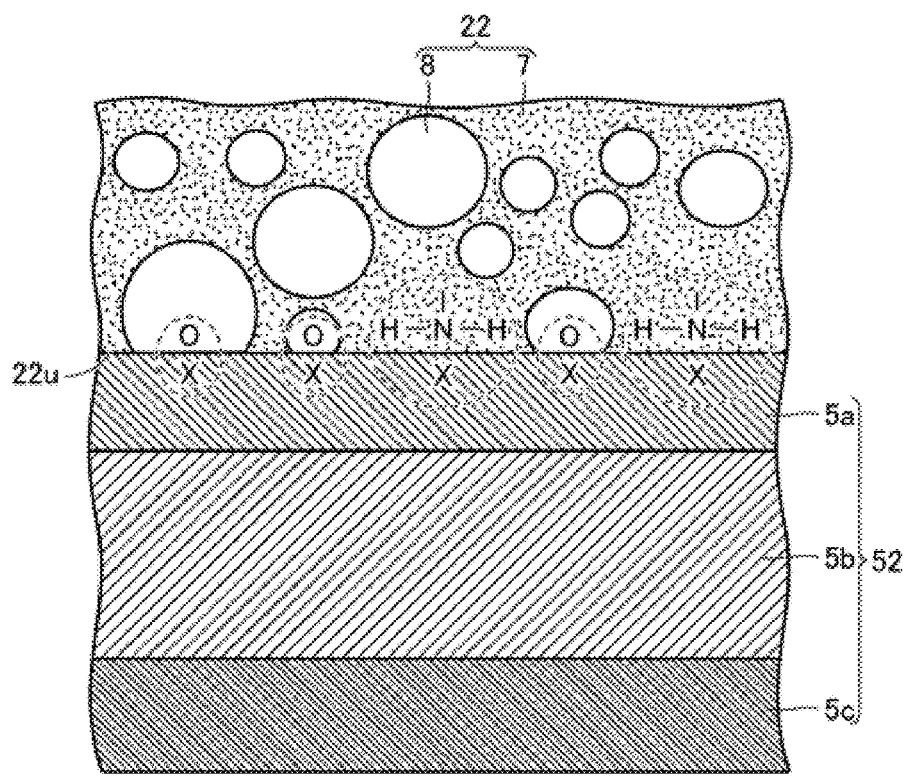
FIG. 25 is an enlarged sectional view of a Z3 portion of the first modified example of the module in the fourth embodiment based on the present disclosure.

As a first modified example of the module in the present embodiment, the one as illustrated in FIGS. 24 and 25 is also conceived. FIG. 24 illustrates an enlarged Z1 portion of the module of this modified example, and FIG. 25 illustrates an enlarged Z3 portion of the module of this modified example. On the surface 21u of the first sealing resin 21, a protrusion amount of the filler 8 is smaller than that of the first embodiment, and the surface 21u is substantially flat. On the surface 22u of the second sealing resin 22 too, the protrusion amount of the filler 8 is smaller than that of the first embodiment, and the surface 22u is substantially flat.

Figure 26:
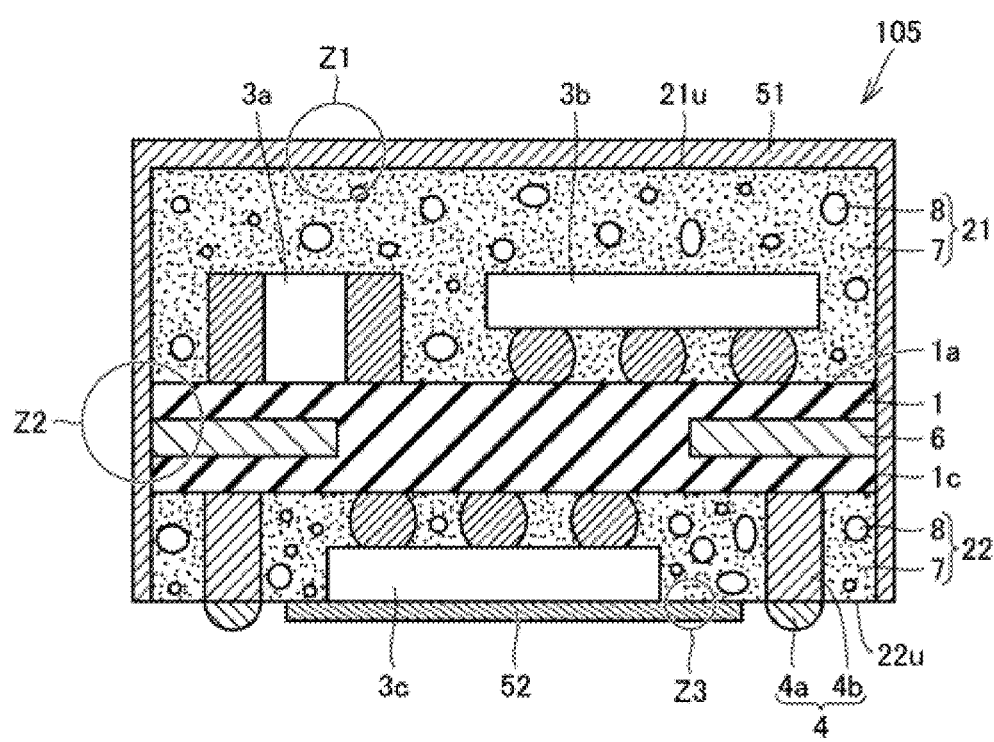
FIG. 26 is a sectional view of a second modified example of the module in the fourth embodiment based on the present disclosure.

As a second modified example of the module in the present embodiment, a module 105 is illustrated in FIG. 26. In the module 105, the component 3c mounted on the main surface 1b of the substrate 1 is exposed from the second sealing resin 22, and the second shield film 52 is arranged so as to be in contact with the exposed surface of the component 3c. In the module 105 too, it is possible to select whether the Z1 portion and the Z3 portion are configured as illustrated in FIGS. 22 and 23, respectively, or are configured as illustrated in FIGS. 24 and 25, respectively.

Note that a plurality of the above-described embodiments may be adopted by being appropriately combined with one another.

Note that the above-described embodiments disclosed at this time are examples in all respects and are not restrictive. The scope of the present disclosure is indicated by the claims and includes all modifications within the meaning and scope equivalent to the claims.

1: Substrate
1a, 1b: Main surface
1c: Side surface
2: Sealing resin
2u, 21u, 22u: Surface
3a, 3b, 3c: Component
4: External terminal
4a: Solder bump
4b: Columnar conductor
5: Shield film
5a: Close contact layer
5b: Conductive layer
5c: Anticorrosive layer 6: Electrode
6a: Oxide film
7: Resin component
8: Filler
15: Nitrogen ion
16: Metal particle
21: First sealing resin
22: Second sealing resin
51: First shield film
52: Second shield film
101, 102, 103, 104, 105: Module

The invention claimed is:

1. A module comprising:
a substrate having a main surface and a side surface;
an electronic component mounted on the main surface;
a sealing resin covering the main surface and the electronic component; and
a shield film covering a surface of the sealing resin and the side surface of the substrate, wherein
the sealing resin includes a resin component containing an organic resin as a main component and a granular filler containing an inorganic oxide as a main component,
on the surface of the sealing resin being in contact with the shield film, parts of some grains of the filler are exposed from the resin component,
a surface of the resin component includes a nitrogen functional group, and
the shield film is composed of a metal or an alloy containing the metal, and the metal is a passivation metal and also is a transition metal.

2. The module according to claim 1, wherein the shield film includes a close contact layer on a surface of the shield film being in contact with the sealing resin.

3. The module according to claim 2, wherein the substrate has an electrode built therein so that the electrode is exposed on the side surface, and the electrode and the close contact layer are electrically connected to each other on the side surface.

4. A module comprising:
a substrate having a first main surface, a second main surface present on an opposite side to the first main surface, and a side surface;
a first electronic component and a second electronic component mounted on the first main surface and the second main surface, respectively;
a first sealing resin covering the first main surface and the first electronic component;
a second sealing resin covering the second main surface and the second electronic component; and
a first shield film covering a surface of the first sealing resin, the side surface of the substrate, and a side surface of the second sealing resin, wherein
the first sealing resin includes a resin component containing an organic resin as a main component, and a granular filler containing an inorganic oxide as a main component,
on the surface of the first sealing resin being in contact with the first shield film, parts of some grains of the filler are exposed from the resin component,
a surface of the resin component includes a nitrogen functional group, and
the first shield film is composed of a metal or an alloy containing the metal, and the metal is a passivation metal and also is a transition metal.

5. The module according to claim 4, wherein the first shield film includes a close contact layer on a surface being in contact with the first sealing resin.

6. The module according to claim 4, further comprising a second shield film covering a part of a surface of the second sealing resin, wherein
on the part of the surface of the second sealing resin being in contact with the second shield film, parts of some grains of the filler are exposed from the resin component.

7. The module according to claim 6, wherein the second shield film includes a close contact layer on a surface being in contact with the second sealing resin.

8. The module according to claim 1, wherein exposed surfaces of the grains are flat on spots where the grains of the filler are exposed from the resin component.

9. A method for manufacturing a module, the method comprising:
a step of preparing a substrate having a main surface and a side surface, and having an electronic component mounted on the main surface;
a step of forming a sealing resin so that the sealing resin covers the main surface and the electronic component;
a step of applying nitrogen ions to a surface of the sealing resin and the side surface of the substrate; and
a step of forming a shield film so that the shield film covers the surface of the sealing resin and the side surface of the substrate, wherein
the sealing resin includes a resin component containing an organic resin as a main component and a granular filler containing an inorganic oxide as a main component,
on the surface of the sealing resin being in contact with the shield film, parts of some grains of the filler are exposed from the resin component, and
the shield film is composed of a metal or an alloy containing the metal, and the metal is a passivation metal and also is a transition metal.

10. The method for manufacturing a module according to claim 9, further comprising a step of flattening exposed portions of the grains of the filler by grinding or polishing the surface of the sealing resin on which the parts of the grains of the filler are exposed from the resin component.

11. The module according to claim 2, wherein exposed surfaces of the grains are flat on spots where the grains of the filler are exposed from the resin component.

12. The module according to claim 3, wherein exposed surfaces of the grains are flat on spots where the grains of the filler are exposed from the resin component.

13. The module according to claim 4, wherein exposed surfaces of the grains are flat on spots where the grains of the filler are exposed from the resin component.

14. The module according to claim 5, wherein exposed surfaces of the grains are flat on spots where the grains of the filler are exposed from the resin component.

15. The module according to claim 6, wherein exposed surfaces of the grains are flat on spots where the grains of the filler are exposed from the resin component.

16. The module according to claim 7, wherein exposed surfaces of the grains are flat on spots where the grains of the filler are exposed from the resin component.

* * * * *